(12) United States Patent
Bharath et al.

(10) Patent No.: US 12,224,252 B2
(45) Date of Patent: Feb. 11, 2025

(54) MAGNETIC CORE INDUCTORS IN INTERPOSER

(71) Applicant: Intel Corporation, Santa Clara, CA (US)

(72) Inventors: Krishna Bharath, Phoenix, AZ (US); William J. Lambert, Tempe, AZ (US); Haifa Hariri, Phoenix, AZ (US); Siddharth Kulasekaran, Chandler, AZ (US); Mathew Manusharow, Phoenix, AZ (US); Anne Augustine, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 992 days.

(21) Appl. No.: 17/030,121

(22) Filed: Sep. 23, 2020

(65) Prior Publication Data
US 2022/0093536 A1    Mar. 24, 2022

(51) Int. Cl.
| | |
|---|---|
| *H01L 23/64* | (2006.01) |
| *H01L 21/48* | (2006.01) |
| *H01L 23/00* | (2006.01) |
| *H01L 23/498* | (2006.01) |
| *H01L 23/552* | (2006.01) |

(52) U.S. Cl.
CPC ........ *H01L 23/645* (2013.01); *H01L 21/4857* (2013.01); *H01L 23/49822* (2013.01); *H01L 23/49833* (2013.01); *H01L 23/49838* (2013.01); *H01L 23/552* (2013.01); *H01L 24/16* (2013.01); *H01L 2224/16225* (2013.01); *H01L 2924/19042* (2013.01); *H01L 2924/19103* (2013.01); *H01L 2924/3025* (2013.01)

(58) Field of Classification Search
None
See application file for complete search history.

(56) References Cited

U.S. PATENT DOCUMENTS

| | | | |
|---|---|---|---|
| 10,085,342 B2 * | 9/2018 | Cheah | H01F 41/046 |
| 2019/0274217 A1 * | 9/2019 | Zhang | H05K 3/0026 |
| 2019/0279806 A1 * | 9/2019 | Darmawikarta | H01F 27/2804 |
| 2019/0304661 A1 * | 10/2019 | Xu | H01F 17/0006 |
| 2020/0168536 A1 * | 5/2020 | Link | H01L 23/49827 |

* cited by examiner

*Primary Examiner* — Mounir S Amer
(74) *Attorney, Agent, or Firm* — Schwabe, Williamson & Wyatt, P.C.

(57) ABSTRACT

Embodiments disclosed herein include coreless interposers with embedded inductors. In an embodiment, a coreless interposer comprises a plurality of buildup layers, where electrical routing is provided in the plurality of buildup layers. In an embodiment, the coreless interposer further comprises an inductor embedded in the plurality of buildup layers. In an embodiment, the inductor comprises a magnetic shell, and a conductive lining over an interior surface of the magnetic shell.

25 Claims, 10 Drawing Sheets

//MAGNETIC CORE INDUCTORS IN INTERPOSER

TECHNICAL FIELD

Embodiments of the present disclosure relate to semiconductor devices, and more particularly to electronic packages with magnetic core inductors integrated into an interposer.

BACKGROUND

Patch on interposer (PoINT) architectures have been useful in reducing costs of packaging in certain server package architectures. In a PoINT architecture, a high density interconnect (HDI) patch is provided over a low density interconnect (LDI) interposer. HDI routing functionality may be segregated to the patch, and the remainder of the routing is implemented on the LDI interposer. This allows for the size of the package substrate (i.e., the patch) that requires HDI functionality to be reduced, and therefore reduces the overall cost. Currently, the patch is implemented with a cored package substrate. The core is a suitable place to integrate inductors for power management (e.g., a fully integrated voltage regulator (FIVR)).

Further cost reductions of the PoINT architecture are desirable. One way to reduce costs of the patch substrate is to eliminate the presence of the core. That is, it is desirable to implement the patch with a so-called "coreless" architecture. However, removing the core from the patch has not been implemented to date because the solutions for where to move the FIVR inductors are non-optimal. One solution is to provide discrete inductors on the patch land side. However, the integration of discrete inductors is problematic. For example, the thickness of the discrete inductors needs to be less than the gap between the interposer and the patch (which can be as small as 140 μm). Reducing the thickness reduces the volume of the magnetic material. As such, inductor performance is negatively impacted. Additionally, with each processing core requiring its own inductor module, the number of inductor modules needed is large (e.g., greater than 100 in some applications). This increases assembly complexity and cost. Additionally, discrete inductors will compete for real estate with decoupling capacitors or mid-level interconnect (MLI) BGA balls for the FIVR input supply. Utilizing integrated planar magnetic core inductor architectures has also been proposed. However, planar magnetic core inductors add cost and complexity to the HDI substrate, which defeats the purpose of reducing costs.

EMBODIMENTS OF THE PRESENT DISCLOSURE

Figure 1:
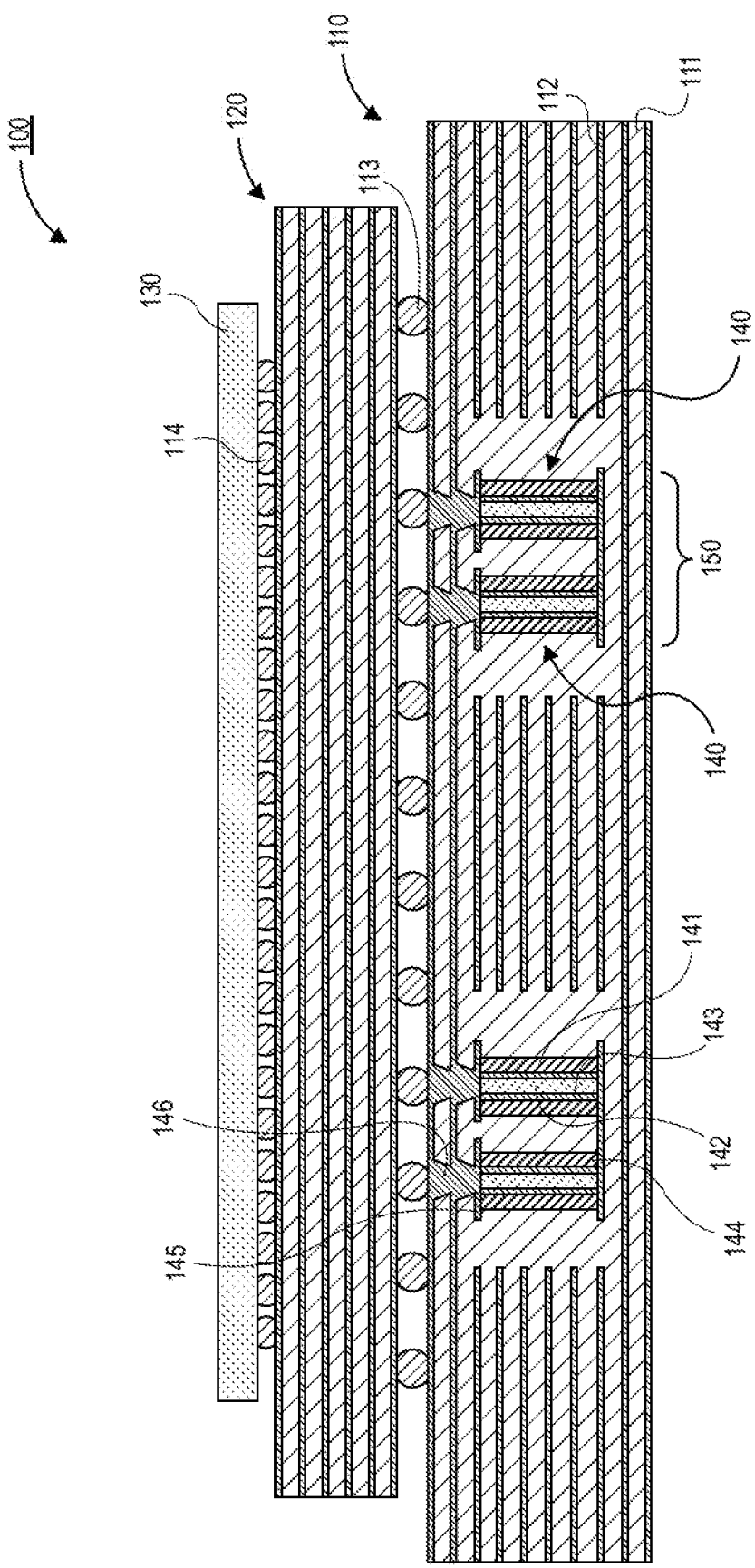
FIG. 1 is a cross-sectional illustration of an electronic system with a patch on interposer (PoINT) architecture that includes coax metal inductor loop (MIL) structures embedded in the interposer, in accordance with an embodiment.

Described herein are electronic packages with magnetic core inductors integrated into an interposer, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, cost savings in a patch on interposer (PoINT) architecture may be obtained by moving towards a coreless patch. However, removal of the core in the patch results in the need to relocate the inductors for the power control (e.g., fully integrated voltage regulators (FIVR)). Discrete inductors and planar coaxial magnetic integrated inductor (coax MIL) solutions do not provide acceptable solutions due to, for example, increases in complexity, thickness constraints, and land side real estate considerations.

Accordingly, embodiments disclosed herein include a coaxial magnetic integrated inductor (coax MIL) architecture that can be integrated into the low cost low density interconnect (LDI) interposer. In an embodiment, the coax MIL structures are embedded in the buildup layers of the interposer. As such, there is no increase in the Z-height and the real estate on the land side of the patch is freed up for other uses. In an embodiment, the coax MIL structures comprise a magnetic shell with a conductive via lining an interior surface of the magnetic shell. In an embodiment, the coax MIL structure may extend through any number of the buildup layers of the interposer in order to provide a desired inductance. Two or more coax MIL structures may be coupled together to provide an inductor loop with even more inductance. Enhanced coupling of the coax MIL structures may also be provided by including a pair of conductive vias within a single magnetic shell.

Embodiments disclosed herein may also include solenoid style inductors and transformers that are embedded in the interposer. Such embodiments are particularly beneficial for low layer count interposers since the inductance is not tied to a thickness of the inductor. In such embodiments, the windings of the inductor may be fabricated using conductive features that are fabricated in parallel with other routing in the interposer. After forming the windings, magnetic blocks may be inserted into holes drilled through the interposer so that the windings provide loops around the magnetic blocks.

Referring now to FIG. 1, a cross-sectional illustration of an electronic system 100 is shown, in accordance with an embodiment. In an embodiment, the electronic system 100 may have a PoINT architecture. For example, the electronic system 100 may comprise an interposer 110 and a patch 120 attached to the interposer 110 by mid-level interconnects (MLIs) 113. A die 130 may be attached to the patch 120 by first level interconnects (FLIs) 114. In an embodiment, the interposer 110 is a low density interconnect (LDI) substrate, and the patch 120 is a high density interconnects (HDI) substrate. In a particular embodiment, the interposer 110 and the patch 120 are coreless substrates. That is, a core layer (e.g., a fiber reinforced dielectric) is omitted from the interposer 110 and the patch 120.

In an embodiment, the interposer 110 may comprise a plurality of buildup layers 111. The buildup layers 111 may be dielectric layers (e.g., build up film) that are formed over each other with a lamination process. In other embodiments, the buildup layers 111 may comprise laminated prepreg materials. In an embodiment, conductive features 112 may be formed in or on the buildup layers 111. Conductive features 112 are shown as traces only for simplicity. However, it is to be appreciated that conductive features 112 may include pads, vias, traces, etc. as is common in package substrate fabrication.

In an embodiment, inductor loops 150 may be provided in the interposer 110. For example, the inductor loops 150 may be entirely embedded in the buildup layers 111. In an embodiment, the inductor loops 150 may comprise a pair of coax MIL structures 140. Each of the coax MIL structures 140 may include a magnetic shell 141 and a conductive layer 143 lining an interior surface of the magnetic shell 141. A plug 142 may fill the opening between the conductive layer 143.

In an embodiment, the magnetic shell 141 may be any suitable magnetic material. In a particular embodiment, the magnetic material comprises an epoxy with magnetic particles distributed therein. For example, the magnetic particles may include, but are not limited to ferrites, iron alloys, and cobalt. In an embodiment, the magnetic shell 141 may have any suitable dimension. For example, the magnetic shell 141 may have an outer diameter that is between 200 μm and 700 μm, and an inner diameter that is between 100 μm and 400 μm. In an embodiment, the conductive layer 143 may comprise copper or another suitable conductive material. In an embodiment, the plug 142 may be an insulative material, such as an epoxy. In yet another embodiment, the plug 142 may be magnetic as well. For example, the plug 142 may be an insulative material or a magnetic composite material.

In an embodiment, the coax MIL structures 140 may comprise a top pad 145. The top pad 145 extends across a first end of the coax MIL structures 140 that faces toward the patch 120. In embodiments where the first end of the coax MIL structures 140 are below a topmost surface of the interposer 110, vias 146 may be provided to electrically couple the coax MIL structures 140 to the topmost surface of the interposer 110. The second end of the coax MIL structure 140 that faces away from the patch 120 may be covered by a conductive pad 144. The conductive pad 144 electrically couples together two coax MIL structures 140 in order to form the inductor loop 150.

In the illustrated embodiment, a pair of inductor loops 150 are shown for simplicity. However, it is to be appreciated that any number of inductor loops 150 (e.g., one or more) may be provided in the interposer 110. In some embodiments, one hundred or more inductor loops 150 or one thousand or more inductor loops 150 may be provided in the interposer 110.

Referring now to FIGS. 2A-2H, a series of cross-sectional illustrations depicting a process for fabricating an interposer similar to the interposer in FIG. 1 is shown, in accordance with an embodiment.

Figure 2A:
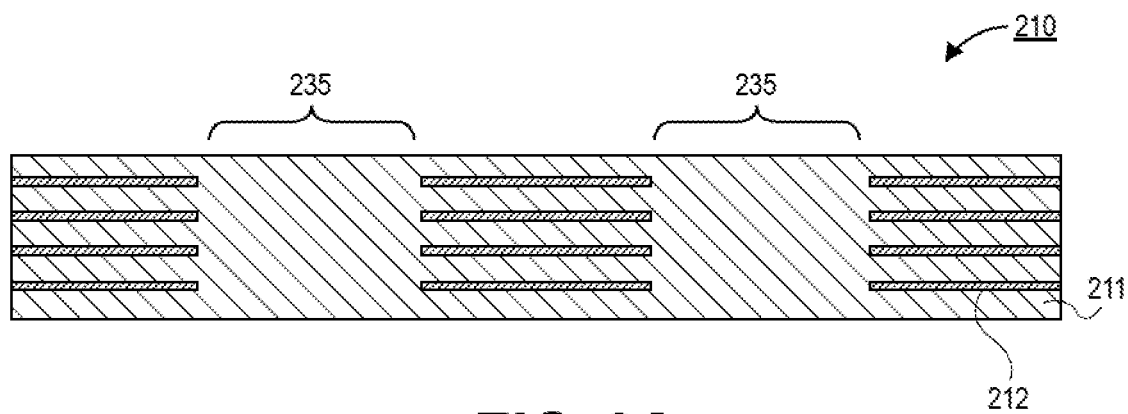
FIGS. 2A-2H are cross-sectional illustrations depicting a process for fabricating coax MIL structures in a coreless interposer, in accordance with an embodiment.

Referring now to FIG. 2A, a cross-sectional illustration of an interposer 210 at a stage of manufacture is shown, in accordance with an embodiment. A shown, a plurality of buildup layers 211 and conductive routing 212 has been formed. In an embodiment, voided regions 235 may be included in the buildup layers 211. Voided regions 235 may be regions that are substantially free of conductive routing 212. The voided regions 235 are where the coax MIL structures will be formed. While two voided regions 235 are shown, it is to be appreciated that any number of voided regions 235 may be formed.

Figure 2B:
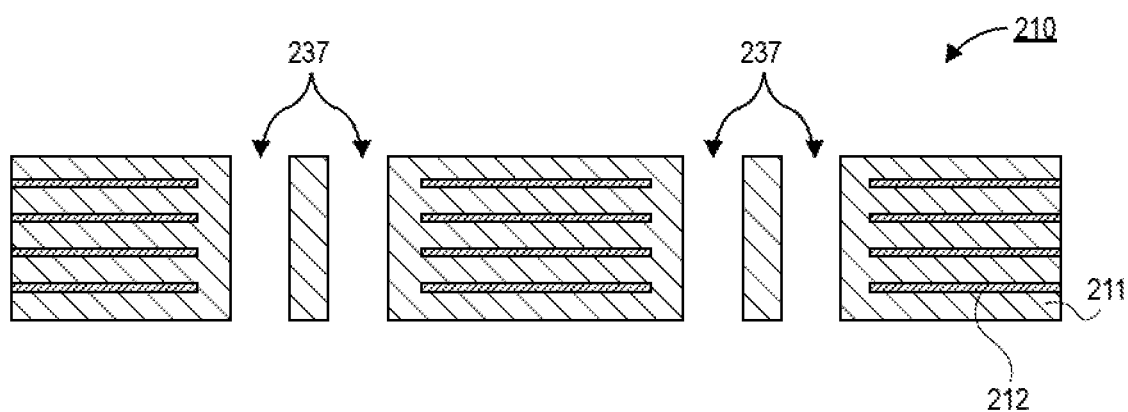

Referring now to FIG. 2B, a cross-sectional illustration of the interposer 210 after first openings 237 are formed through the interposer 210. In an embodiment, the first openings 237 may have a diameter that is between 200 μm and 700 μm. The first openings 237 may be formed with a mechanical drilling process or a laser drilling process. In the illustrated embodiment, sidewalls of the first openings 237 are shown as being substantially vertical. However, in some embodiments all or portions of the sidewalls 237 may be tapered (e.g., when laser drilling is used).

Figure 2C:
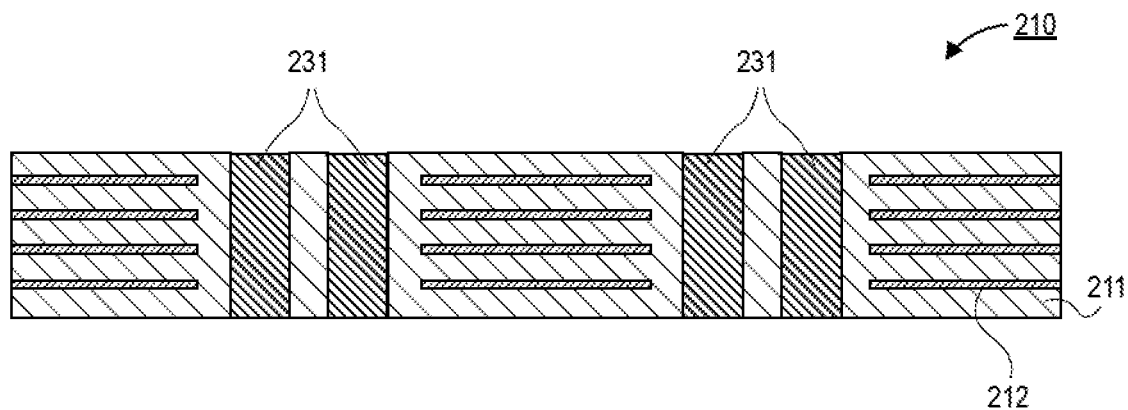

Referring now to FIG. 2C, a cross-sectional illustration of the interposer 210 after a magnetic material 231 is disposed into the first openings 237 is shown, in accordance with an embodiment. In an embodiment, the magnetic material may be an epoxy or the like that includes magnetic filler particles. By way of example, and not by way of limitation, the filler particles may include ferrites, iron alloys, or cobalt. After the magnetic material 231 is disposed into the first openings 237, the magnetic material may be cured.

Figure 2D:
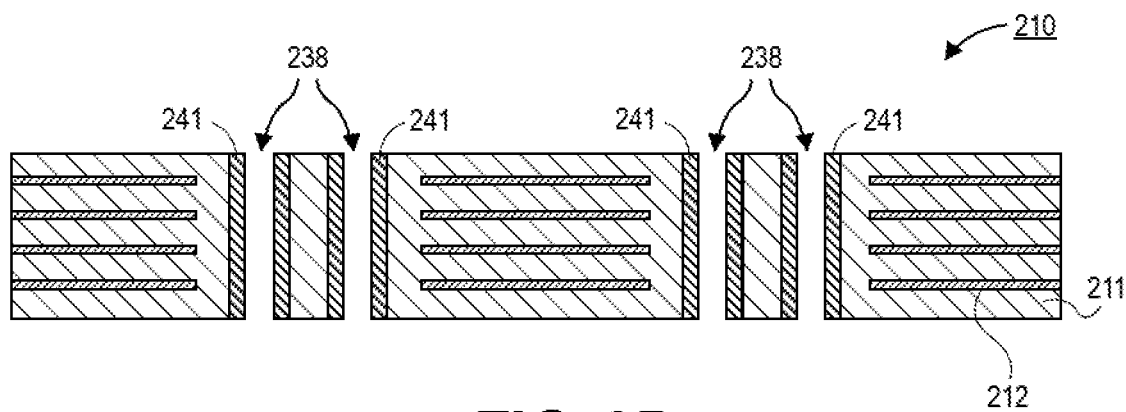

Referring now to FIG. 2D, a cross-sectional illustration of the interposer 210 after second openings 238 are formed through the interposer 210 is shown, in accordance with an embodiment. In an embodiment, the second openings 238 may be substantially aligned with an axial center of the magnetic material 231. That is, formation of the second openings 238 includes the removal of a core of the magnetic material 231. As such, magnetic shells 241 are formed by the second openings 238. In an embodiment, the second openings 238 may have a diameter that is between approximately 100 μm and approximately 400 μm.

The second openings 238 may be formed with a mechanical drilling process or a laser drilling process. Mechanical drilling processes may result in an interior surface of the magnetic shells 241 that are substantially vertical, as shown in FIG. 2D. In embodiments that utilize a laser drilling process, portions or all of the interior surface of the magnetic shells 241 may be tapered.

Figure 2E:
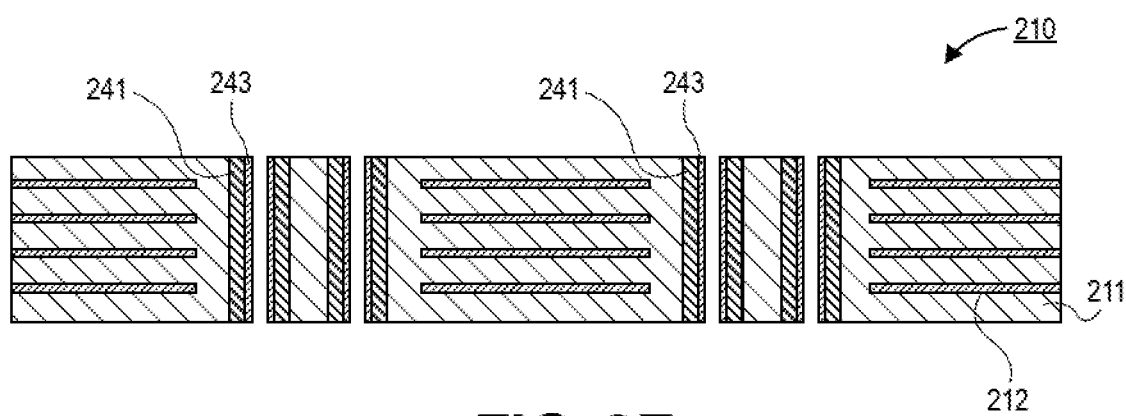

Referring now to FIG. 2E, a cross-sectional illustration of the interposer 210 after a conductive layer 243 is disposed over the interior surfaces of the magnetic shell 241 is shown, in accordance with an embodiment. In an embodiment, the conductive layer 243 may be copper or the like. The deposition thickness of the conductive layer 243 may be such that not the entire second opening 238 is filled. In some embodiments, the conductive layer 243 may be referred to as a plated through hole (PTH).

Figure 2F:
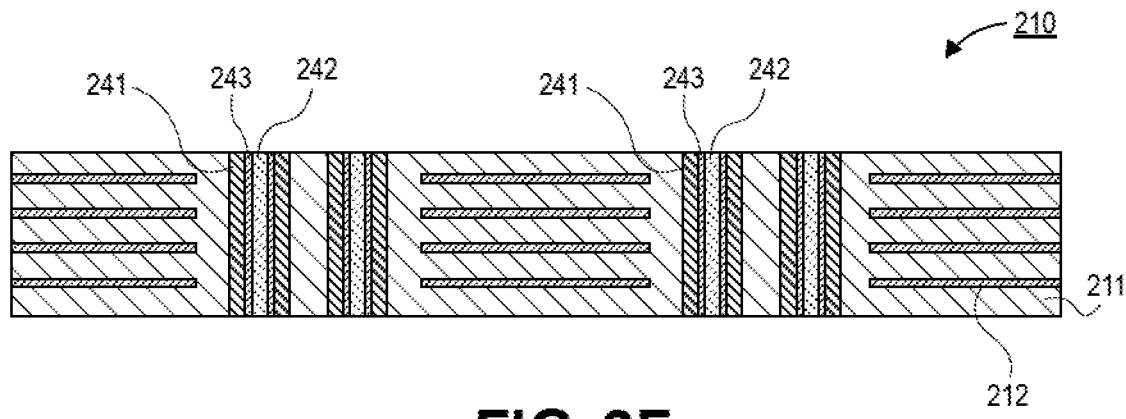

Referring now to FIG. 2F, a cross-sectional illustration of the interposer 210 after a plug 242 is deposited in the second openings 238 is shown, in accordance with an embodiment. In an embodiment, the plugs 242 may fill the remainder of the second openings 238. In an embodiment, the plug 242 is an insulative material. In yet another embodiment, the plug 242 may be magnetic as well. For example, the plug 242 may be an insulative material or a magnetic composite material.

Figure 2G:
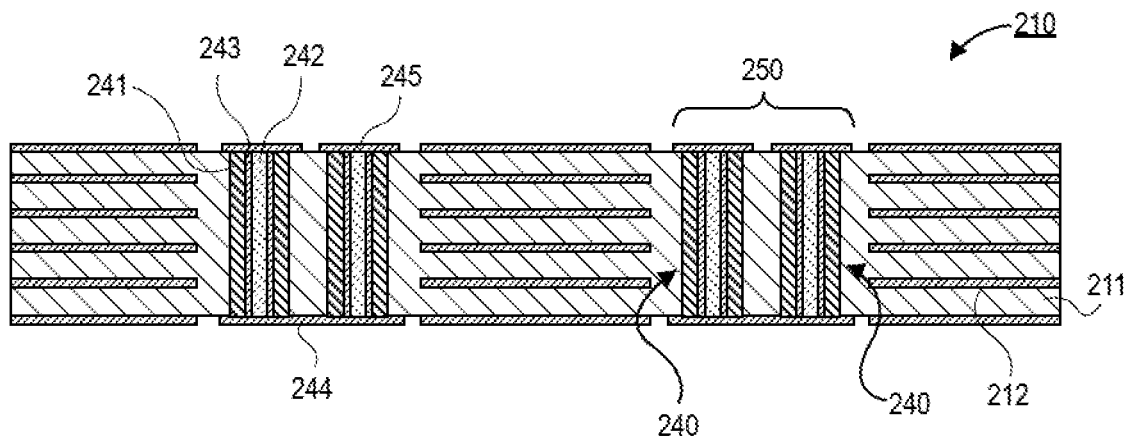

Referring now to FIG. 2G, a cross-sectional illustration of the interposer 210 after pads 245 and 244 are formed over the conductive layer 243 is shown, in accordance with an embodiment. The pads 245 may be disposed over a first end of the conductive layers 243. The pads 245 on the first end may be isolated from each other. The pads 244 may be disposed over a second end of the conductive layers 243. The pads 244 may provide electrical coupling between neighboring conductive layers 243. As such, an inductor loop 250 including a first coax MIL structure 240 and a second coax MIL structure 240 is provided. The conductive path of the inductor loop 250 starts at a first pad 245, extends down a first coax MIL structure 240, travels across a pad 244 to a second coax MIL structure 240, and extends up the second coax MIL structure 240 to a second pad 245.

Figure 2H:
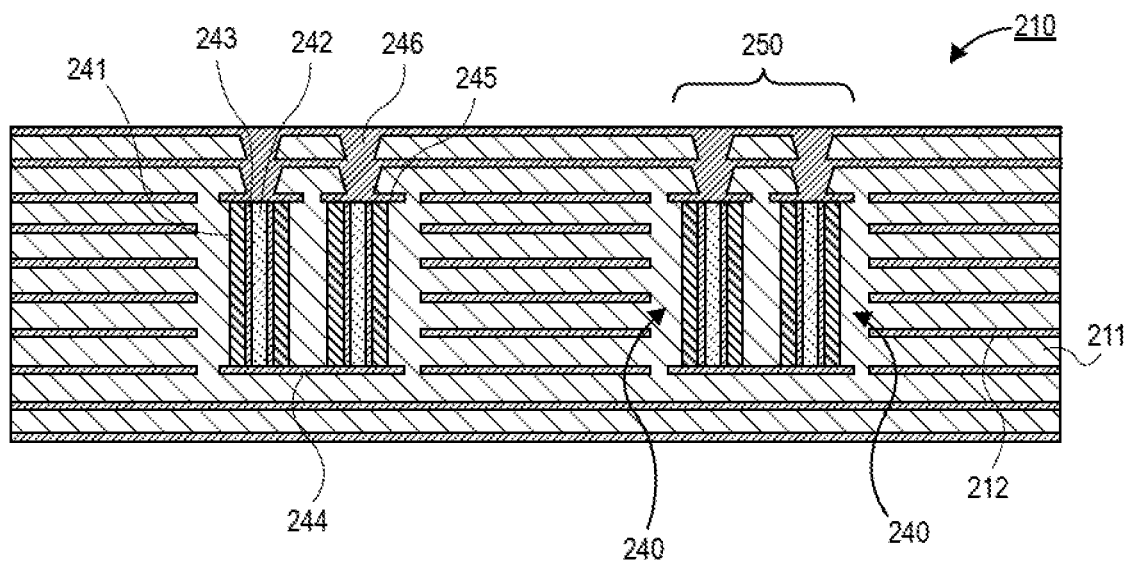

Referring now to FIG. 2H, a cross-sectional illustration of the interposer 210 after additional buildup layers 211 are provided over a top surface and a bottom surface is shown, in accordance with an embodiment. The additional buildup layers 211 (and routing 212) may be provided using standard package assembly processes (e.g., lamination, plating, etc.). In an embodiment, vias 246 may be included in the assembly of the additional buildup layers 211 in order to provide electrical coupling of the inductor loop 250 to a topmost surface of the interposer 210.

The inductor loops 150/250 in FIGS. 1-2H are suitable for interposers with a high layer count. This is because the inductance is dependent on the height of the coax MIL structures. That is, more layers allow for taller coax MIL structures, and therefore, a higher inductance. However, not all interposers may have a high enough layer count in order to provide a desired inductance. As such, embodiments disclosed herein also include solenoid style inductors that are capable of providing multiple loops around magnetic blocks. Such inductors provide an increased inductance with minimal impact on interposer thickness.

Figure 3A:
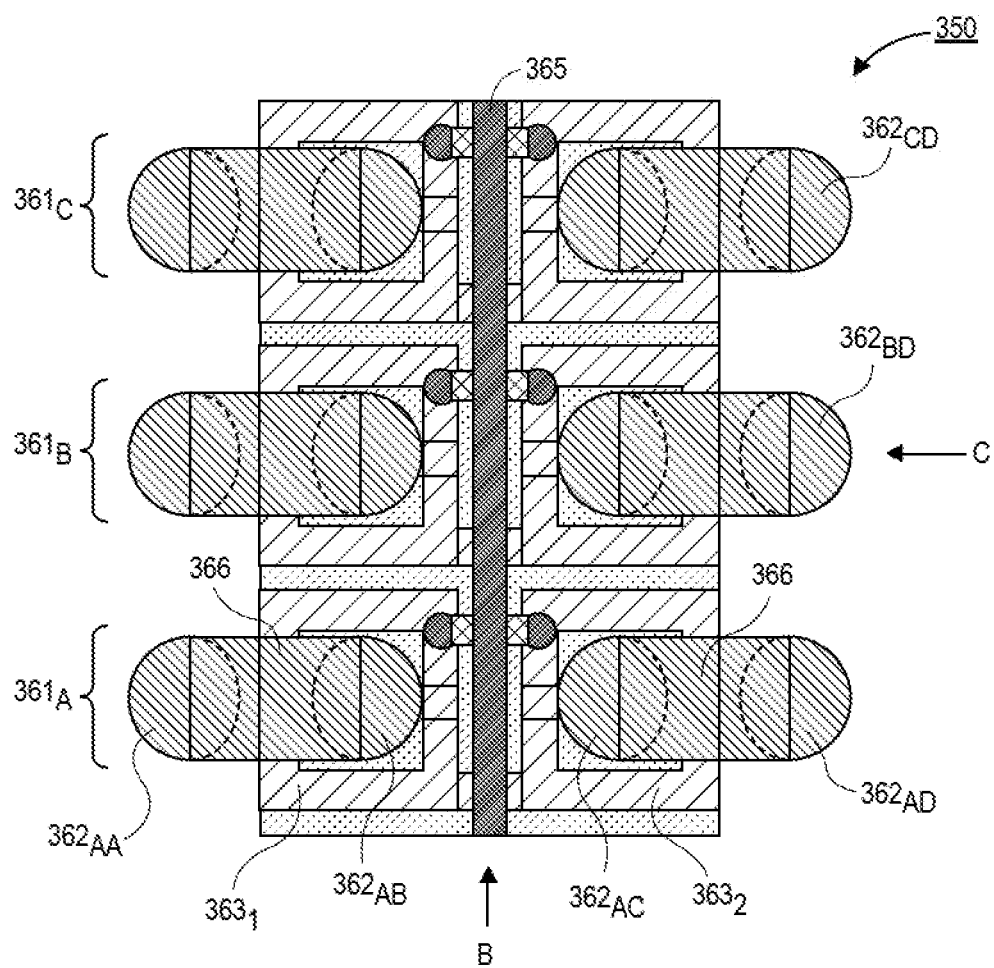
FIG. 3A is a plan view illustration of an inductor that is embeddable in a coreless interposer, in accordance with an embodiment.
Figure 3B:
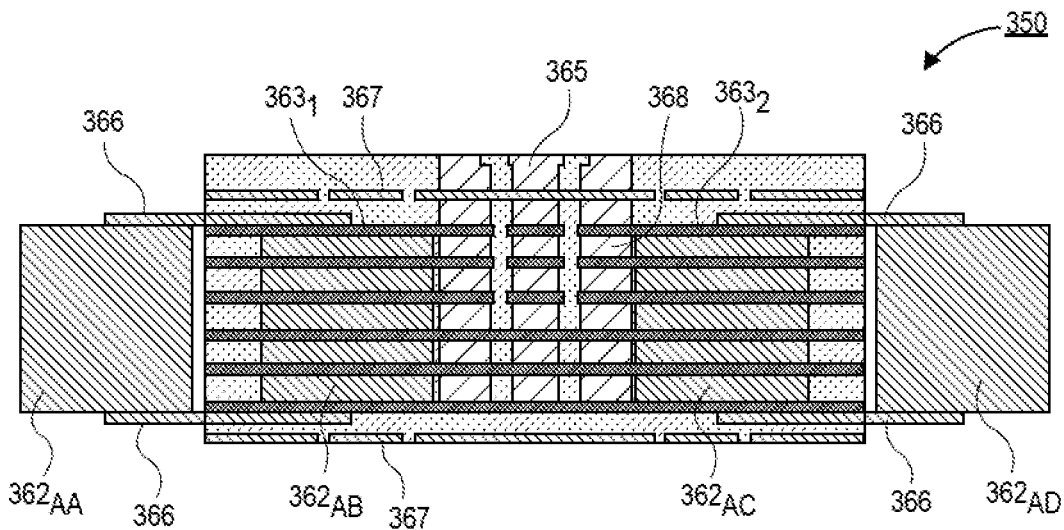
FIG. 3B is a side view of the inductor in FIG. 3A, in accordance with an embodiment.
Figure 3C:
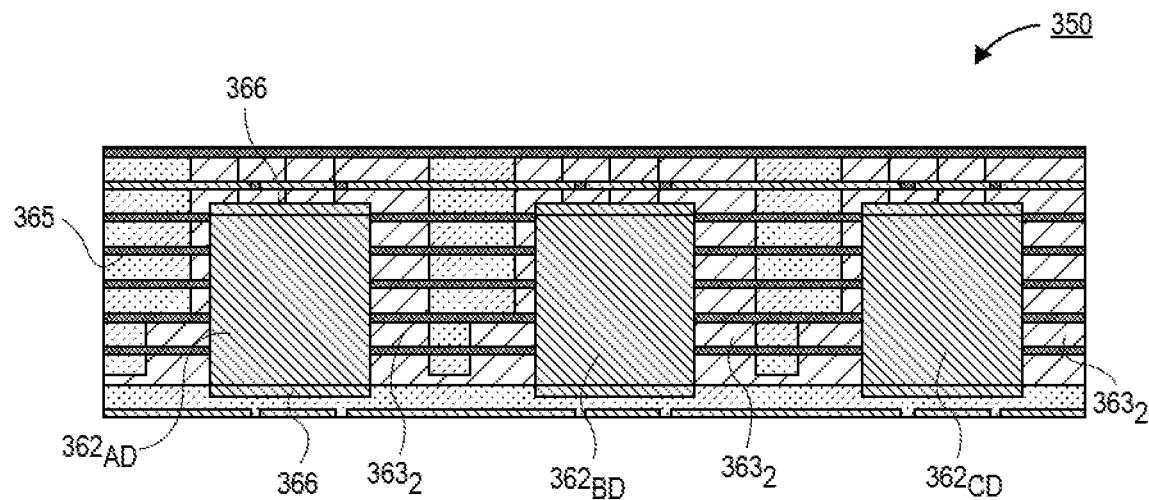
FIG. 3C is an additional side view of the inductor in FIG. 3A, in accordance with an embodiment.

Referring now to FIGS. 3A-3C a series of illustrations depicting an inductor 350 that can be embedded in an interposer is shown, in accordance with an embodiment. In FIGS. 3A-3C, the interposer itself is omitted in order to not obscure the structure of the inductor 350. FIG. 3A is a top view illustration of the inductor 350. FIG. 3B is a side view illustration of the inductor 350 in FIG. 3A from direction B, and FIG. 3C is a side view illustration of the inductor 350 in FIG. 3A from direction C.

As shown in FIG. 3A, a plurality of rows 361 of magnetic blocks 362 are shown, in accordance with an embodiment. The plurality of rows 361 includes three rows $361_{A-C}$ in FIG. 3A. However, it is to be appreciated that any number of rows 361 may be used. In an embodiment, each row 361 may comprise a plurality of magnetic blocks 362. For example, four magnetic blocks 362 are in each row 361 of FIG. 3A. In the illustrated embodiment a total of twelve magnetic blocks 362 are shown, with the labeling $362_{XY}$ where X is the row and Y is the column (e.g., magnetic blocks $362_{AA}$-$362_{CD}$ are shown in FIG. 3A). However, it is to be appreciated that each of the magnetic blocks 362 may be substantially similar to each other. In an embodiment, the magnetic blocks 362 may be cylindrical in shape.

In an embodiment, within a given row, the first magnetic block $362_{XA}$ and the second magnetic block $362_{XB}$ may be connected to each other by a magnetic lid 366, and the third magnetic block $362_{XC}$ and the fourth magnetic block $362_{XD}$ may be connected to each other by a magnetic lid 366. As shown in FIG. 3B, the bottoms of the magnetic blocks 362 may also be connected to each other by a magnetic lid 366.

In an embodiment, a plurality of conductive loops 363 may surround the magnetic bocks 362. More specifically, conductive loops 363 may surround the second magnetic block $362_{XB}$ and the third magnetic block $362_{XC}$ in each row 361. For example, a first conductive loop $363_1$ may wrap around the magnetic block $362_{AB}$ and a second conductive loop $363_2$ may wrap around the magnetic block $362_{AC}$. As shown in FIGS. 3B and 3C, several layers of the conductive loops $363_1$ and $363_2$ may be provided around each magnetic bock 362. Vias 368 may provide electrical coupling between different layers of the conductive loops 363. In an embodiment, the inductor 350 may also include a central line 365. The central line 365 may have connections out to individual ones of the conductive loops 363.

FIGS. 3B and 3C also illustrate the presence of shielding layers 367. The shielding layers 367 may be conductive features that provide shielding of the magnetic field and electrical noise from the inductor 350. The shielding layers 367 may be provided above and below the inductor 350.

In an embodiment, the inductor 350 may be formed with standard package substrate manufacturing processes. As such, complexity of the interposer is not significantly increased. Particularly, the windings of the conductive loops 363, the vias, and the like may be fabricated using plating and patterning processes for each buildup layer. After the conductive features have been formed, a drilling process may be used to form openings through the buildup layers. The openings may then be filled with a magnetic material to form the magnetic blocks 362. The magnetic material may be an epoxy filled with magnetic particles, such as, but not limited to, ferrites, iron alloys, and cobalt.

Figure 4:
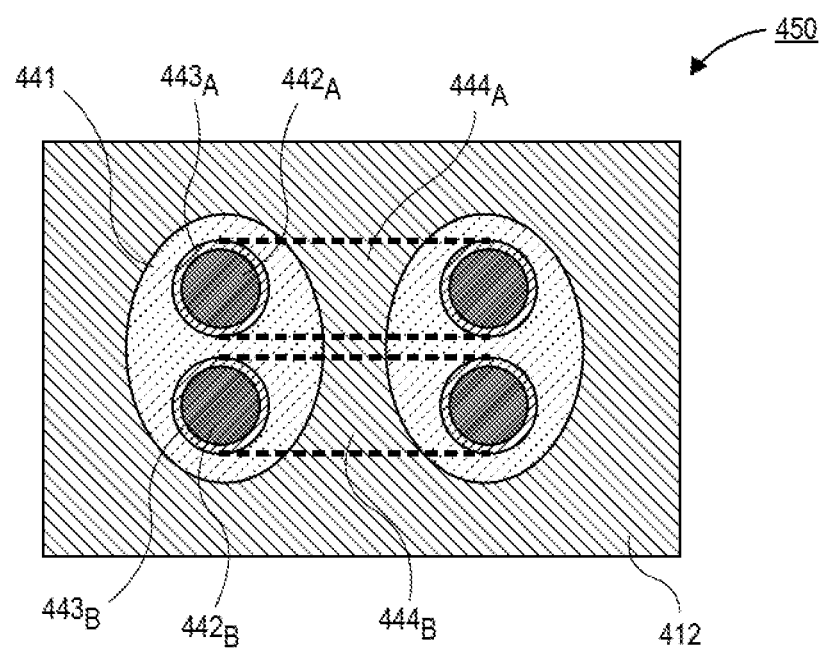
FIG. 4 is a plan view illustration of a highly coupled coax MIL structure for use in a coreless interposer, in accordance with an embodiment.

Referring now to FIG. 4, a plan view illustration of an inductor loop 450 with improved coupling is shown, in accordance with an embodiment. The inductor loop 450 may comprise a pair of coax MIL type structures. The coax MIL structures in FIG. 4 differ from those described above in that a pair of PTHs $443_A$ and $443_B$ are provided within each magnetic shell 441. Forming a pair of PTHs $443_A$ and $443_B$ within a single magnetic shell 441 increases the coupling between the two PTHs $443_A$ and $443_B$. Instead of having a substantially round outer diameter, the magnetic shell 441 may be elongated to accommodate the two PTHs $443_A$ and $443_B$. In the illustrated embodiment, the magnetic shell 441 is an elliptical shape. However, rectangular shaped magnetic shells 441 may also be used. The elongated shape of the magnetic shell 441 may be provided using a routing technique (either mechanical or laser) through the substrate 412. In an embodiment, the PTHs $443_A$ and $443_B$ may be filled by plugs $442_A$ and $442_B$, respectively. In an embodiment, neighboring coax MIL structures may be connected below by traces $444_A$ and $444_B$.

Figure 5A:
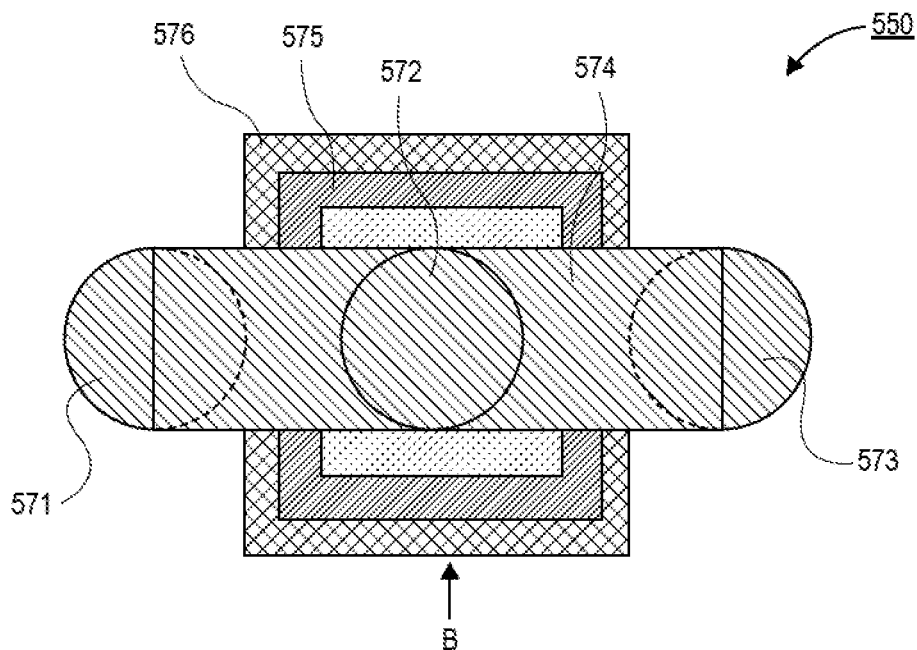
FIG. 5A is a plan view illustration of transformer that can be embedded in a coreless interposer, in accordance with an embodiment.
Figure 5B:
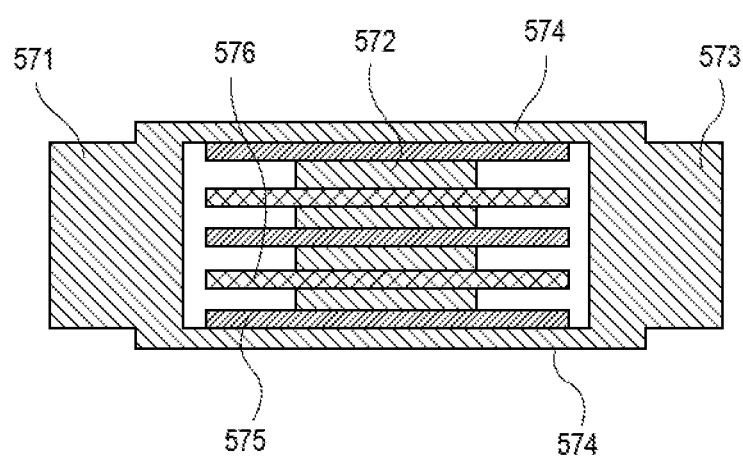
FIG. 5B is a side view of the transformer in FIG. 5A, in accordance with an embodiment.

Referring now to FIGS. 5A and 5B, illustrations of a transformer 550 that may be embedded in a coreless interposer is shown, in accordance with an embodiment. As shown, the transformer 550 may comprise a plurality of magnetic blocks 571, 572, and 573 arranged in a row. The magnetic blocks 571-573 may be coupled together by magnetic lids 574 above and below the magnetic blocks 571-573. In an embodiment, primary windings 575 and secondary windings 576 are provided around the second magnetic block 572. The primary windings 575 and the secondary windings 576 may be in alternating buildup layers surrounding the magnetic blocks 571-573.

In an embodiment, the transformer 550 may be formed using standard package substrate manufacturing operations. For example, the primary windings 575 and the secondary windings 576 may be formed during conductive feature deposition and patterning during the buildup layer formation. After the buildup layers are formed, drilled openings may be made around the windings 575 and 576. The openings may then be filled with magnetic material. The magnetic material may be an epoxy with magnetic filler particles, such as, but not limited to, ferrites, iron alloys, and cobalt.

Figure 6A:
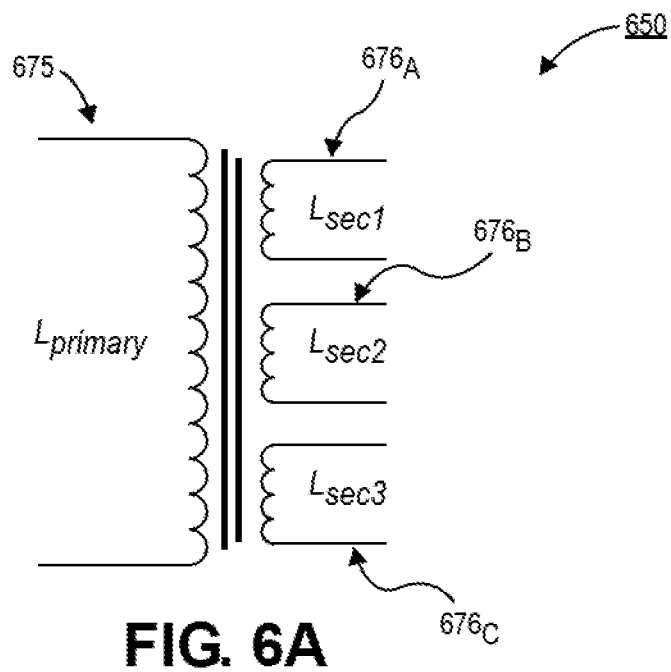
FIG. 6A is an electrical schematic of a transformer with a single primary winding a plurality of secondary windings, in accordance with an embodiment.

Referring now to FIG. 6A, an electrical schematic of a transformer 650 with a single primary winding 675 and a plurality of secondary windings $676_{A-C}$ is shown, in accordance with an embodiment. As shown, the secondary windings $676_{A-C}$ may each interface with a portion of the primary winding 675.

Figure 6B:
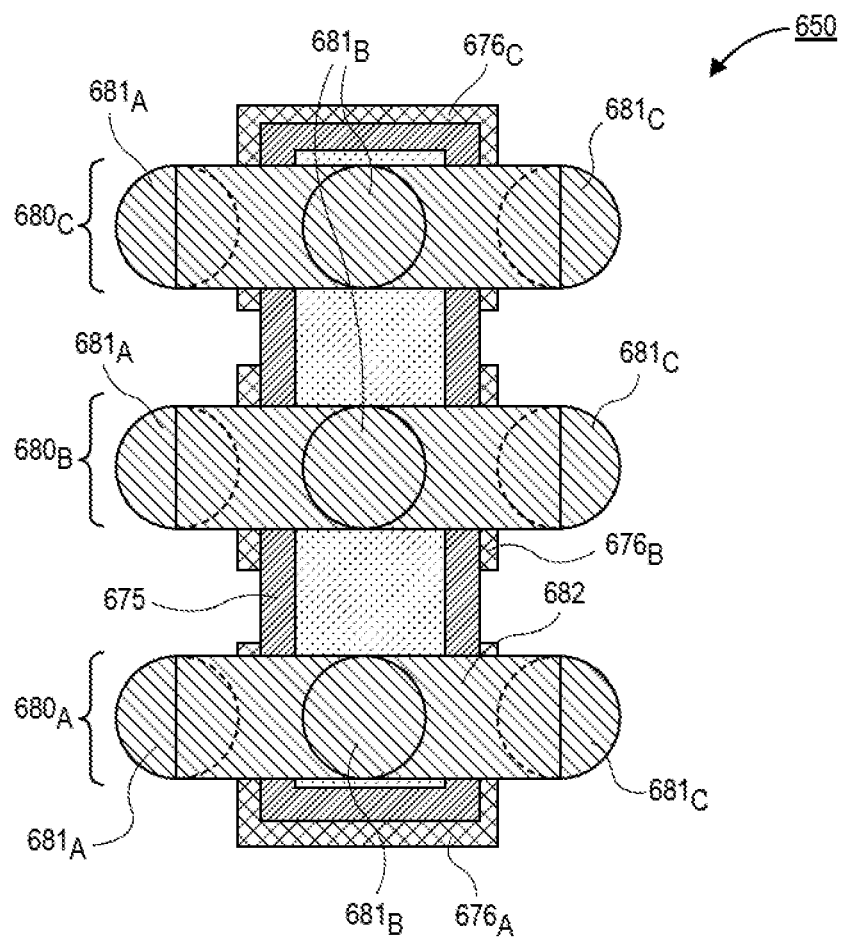
FIG. 6B is a plan view illustration of the transformer in FIG. 6A, in accordance with an embodiment.

Referring now to FIG. 6B, a plan view illustration of a transformer 650 that is the equivalent of the electrical schematic in FIG. 6A is shown, in accordance with an embodiment. In an embodiment, the transformer 650 comprises a plurality of rows $680_{A-C}$ of magnetic blocks 681. Each row includes three magnetic blocks $681_{A-C}$. In an embodiment, the primary winding 675 surrounds the perimeter of the middle magnetic block $681_B$ for all rows $680_{A-C}$. That is, the primary winding 675 is a single loop that wraps around the three magnetic blocks $681_B$. In an embodiment, the transformer 650 comprises a plurality of secondary windings $676_{A-C}$. The secondary windings $676_{A-C}$ are in a different buildup layer than the primary winding 675. Each of the secondary windings 676 wraps around a single one of the second magnetic blocks $681_B$.

In FIG. 6B, a single layer of the primary winding 675 and a single layer of the secondary windings $676_{A-C}$ are shown. However, it is to be appreciated that any number of layers of the primary winding 675 and the secondary windings $676_{A-C}$ may be provided, similar to the embodiment shown in FIG. 5B. That is, primary winding layers and secondary winding layers may be interleaved to provide improved coupling.

In an embodiment, the transformer 650 may be formed using standard package substrate manufacturing operations. For example, the primary windings 675 and the secondary windings 676 may be formed during conductive feature deposition and patterning during the buildup layer formation. After the buildup layers are formed, drilled openings may be made around the windings 675 and 676. The openings may then be filled with magnetic material. The magnetic material may be an epoxy with magnetic filler particles, such as, but not limited to, ferrites, iron alloys, and cobalt.

Figure 7:
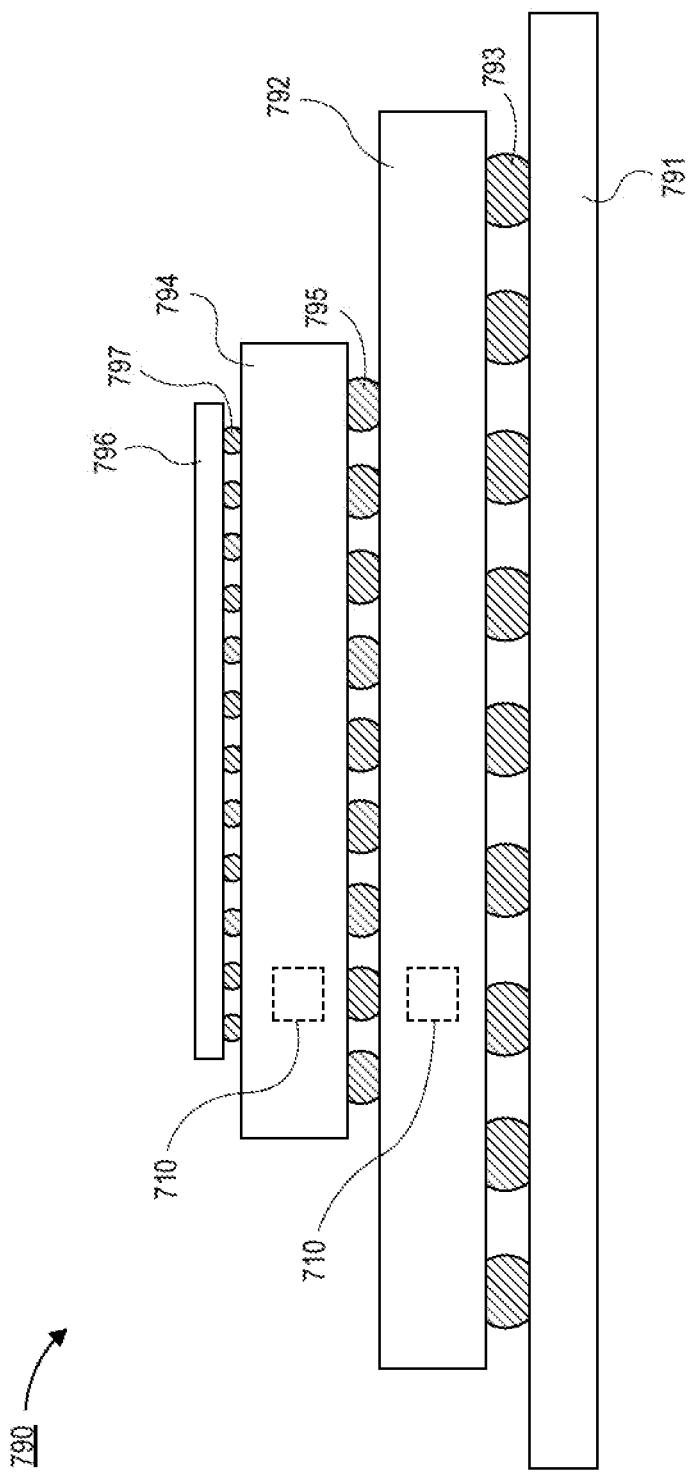
FIG. 7 is a cross-sectional illustration of an electronic system with a PoINT architecture that includes an inductor in a coreless interposer, in accordance with an embodiment.

Referring now to FIG. 7, a cross-sectional illustration of an electronic system 790 is shown, in accordance with an embodiment. In an embodiment, the electronic system 790 may comprise a board 791 (e.g., a printed circuit board (PCB)) and an interposer 792 coupled to the board 791. The interposer 792 may be coupled to the board 791 with any suitable interconnect architecture. For example, interconnects 793 are shown as being solder balls. However, it is to be appreciated that the interposer 792 may be coupled to the board 791 with other interconnects, such as sockets, or the like. In an embodiment, a patch substrate 794 is coupled to the interposer 792 with MLIs 795. A die 796 is coupled to the patch substrate 794 with FLIs 797. In an embodiment, the interposer 792 is a LDI substrate and the patch substrate 794 is an HDI substrate. In an embodiment, the interposer 792 is a coreless substrate, and the patch substrate 694 is also a coreless substrate.

In an embodiment, one or both of the interposer 792 and the patch substrate 794 may include coax MIL structures 710 or other coreless substrate compatible inductors and/or transformers (indicated with dashed boxes). The coax MIL structures 710 may be similar to coax MIL structures described in greater detail above. Particularly, the coax MIL structures 710 may include a magnetic shell that surrounds a PTH. Coreless compatible inductors and/or transformers may include windings that are formed with standard buildup processes, and the magnetic blocks may be inserted into holes drilled through the windings, as described in greater detail above.

Figure 8:
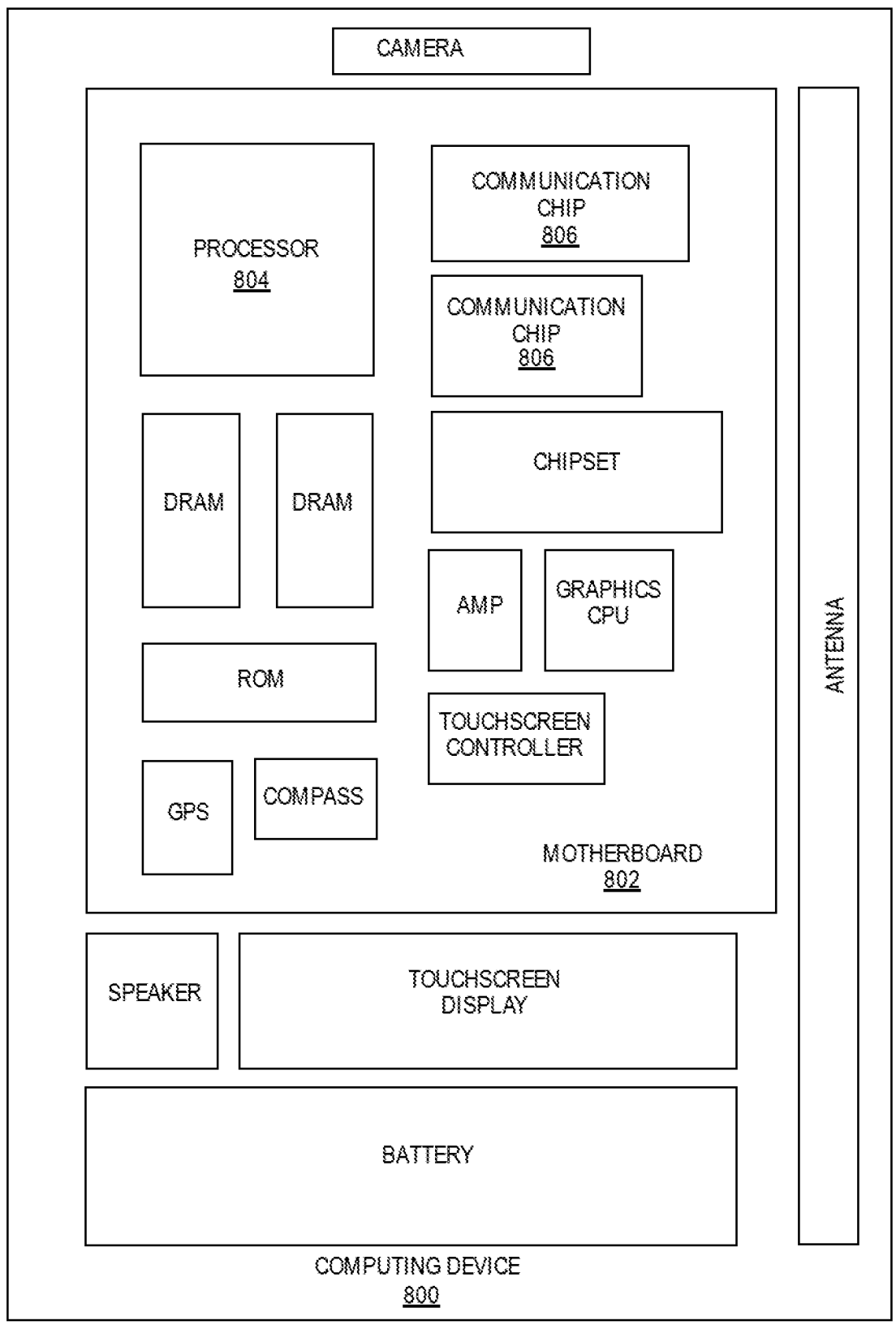
FIG. 8 is a schematic of a computing device built in accordance with an embodiment.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor may be part of a PoINT architecture with a coreless patch and a coreless interposer, where an inductor is formed in the coreless interposer, in accordance with embodiments described herein. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip may be part of a PoINT architecture with a coreless patch and a coreless interposer, where an inductor is formed in the coreless interposer, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a coreless interposer, comprising: a plurality of buildup layers, wherein electrical routing is provided in the plurality of buildup layers; and an inductor embedded in the plurality of buildup layers, wherein the inductor comprises: a magnetic shell; and a conductive lining over an interior surface of the magnetic shell.

Example 2: the coreless interposer of Example 1, wherein the inductor extends through two or more of the plurality of buildup layers.

Example 3: the coreless interposer of Example 1 or Example 2, wherein a first end of the inductor is below a topmost buildup layer, and wherein a second end of the inductor is above a bottommost buildup layer.

Example 4: the coreless interposer of Examples 1-3, further comprising: a second inductor embedded in the plurality of buildup layers, wherein the second inductor comprises: a second magnetic shell; and a second conductive lining over an interior surface of the second magnetic shell.

Example 5: the coreless interposer of Example 4, wherein a first end of the inductor is electrically coupled to a first end of the second inductor by a trace.

Example 6: the coreless interposer of Examples 1-5, wherein a first end of the inductor is electrically coupled to a pad on a topmost surface of the plurality of buildup layers by one or more vias.

Example 7: the coreless interposer of Examples 1-6, further comprising: a second conductive lining over an interior surface of the magnetic shell, wherein the conductive lining and the second conductive lining are coupled together by the magnetic shell.

Example 8: the coreless interposer of Examples 1-7, further comprising: a plug within the conductive lining.

Example 9: the coreless interposer of Examples 1-8, further comprising: a coreless package coupled to the coreless interposer; and a die coupled to the coreless package.

Example 10: a coreless interposer, comprising: a plurality of buildup layers wherein electrical routing is provided in the plurality of buildup layers; an inductor embedded in the plurality of buildup layers, wherein the inductor comprises: a first magnetic block; a second magnetic block, wherein the second magnetic block is connected to the first magnetic block by a first magnetic lid; a third magnetic block; a fourth magnetic block, wherein the fourth magnetic block is connected to the third magnetic block by a second magnetic lid; and a first plurality of conductive loops surrounding the second magnetic block; and a second plurality of conductive loops surrounding the third magnetic block.

Example 11: the coreless interposer of Example 10, wherein the first plurality of conductive loops and the second plurality of conductive loops are disposed in more than one buildup layer of the plurality of buildup layers.

Example 12: the coreless interposer of Example 10 or Example 11, further comprising: shielding layers over a first end and a second end of the inductor.

Example 13: the coreless interposer of Examples 10-12, wherein the first plurality of conductive loops are electrically coupled to the second plurality of conductive loops.

Example 14: the coreless interposer of Examples 10-13, wherein the first magnetic block, the second magnetic block, the third magnetic block, and the fourth magnetic block pass through two or more buildup layers.

Example 15: the coreless interposer of Examples 10-14, wherein the first conductive loops and the second conductive loops are part of the electrical routing in the plurality of buildup layers.

Example 16: the coreless interposer of Examples 10-15, wherein the first magnetic block, the second magnetic block, the third magnetic block, and the fourth magnetic block comprise a first row of magnetic blocks, and wherein the inductor further comprises at least a second row of magnetic blocks.

Example 17: the coreless interposer of Example 16, wherein the inductor further comprises: a third plurality of conductive loops surrounding magnetic blocks in the second row of magnetic blocks; and a fourth plurality of conductive loops surrounding magnetic blocks in the second row of magnetic blocks.

Example 18: the coreless interposer of Examples 10-17, wherein the first magnetic block, the second magnetic block, the third magnetic block, and the fourth magnetic block are cylinders.

Example 19: a coreless interposer, comprising: a plurality of buildup layers, wherein electrical routing is provided in the plurality of buildup layers; and a transformer embedded in the plurality of buildup layers, wherein the transformer comprises: a row of magnetic blocks, wherein the row comprises a first magnetic block, a second magnetic block, and a third magnetic block; a plurality of primary windings around the second magnetic block; and a first plurality of secondary windings around the second magnetic block, wherein the primary windings and the secondary windings are in alternating buildup layers.

Example 20: the coreless interposer of Example 19, further comprising: a second of row of magnetic blocks, wherein the second row of magnetic blocks comprises, a fourth magnetic block, a fifth magnetic block, and a sixth magnetic block, and wherein the plurality of primary windings are around the second magnetic block and the fifth magnetic block; and a second plurality of secondary windings around the fifth magnetic block.

Example 21: the coreless interposer of Example 19 or Example 20, wherein the inductor further comprises: a magnetic lid that couples the second magnetic block to the first magnetic block and the third magnetic block.

Example 22: the coreless interposer of Examples 19-21, wherein the first magnetic block, the second magnetic block, and the third magnetic block are cylinders.

Example 23: the coreless interposer of Examples 19-22, wherein the plurality of primary windings and the first plurality of secondary windings are part of the electrical routing in the plurality of buildup layers.

Example 24: an electronic system, comprising: a board; a coreless interposer coupled to the board, wherein the coreless interposer comprises: an embedded inductor, comprising a magnetic shell with a conductive layer lining an interior surface of the magnetic shell; a coreless patch coupled to the coreless interposer; and a die coupled to the coreless patch.

Example 25: the electronic system of Example 24, wherein the inductor is vertically oriented, and wherein the inductor passes through a plurality of buildup layers of the coreless interposer.

What is claimed is:

1. A coreless interposer, comprising:
a plurality of buildup layers, wherein electrical routing is provided in the plurality of buildup layers; and
an inductor embedded in the plurality of buildup layers, wherein the inductor comprises:
a plurality of discrete magnetic shells; and
a conductive lining over an interior surface of each of the plurality of discrete magnetic shells.

2. The coreless interposer of claim 1, wherein the inductor extends through two or more of the plurality of buildup layers.

3. The coreless interposer of claim 1, wherein a first end of the inductor is below a topmost buildup layer, and wherein a second end of the inductor is above a bottommost buildup layer.

4. The coreless interposer of claim 1, further comprising:
a second inductor embedded in the plurality of buildup layers, wherein the second inductor comprises:
a second magnetic shell; and
a second conductive lining over an interior surface of the second magnetic shell.

5. The coreless interposer of claim 4, wherein a first end of the inductor is electrically coupled to a first end of the second inductor by a trace.

6. The coreless interposer of claim 1, wherein a first end of the inductor is electrically coupled to a pad on a topmost surface of the plurality of buildup layers by one or more vias.

7. The coreless interposer of claim 1, further comprising:
a second conductive lining over an interior surface of each of the plurality of discrete magnetic shells, wherein the conductive lining and the second conductive lining are coupled together by a corresponding one of the plurality of discrete magnetic shells.

8. The coreless interposer of claim 1, further comprising:
a plug within the conductive lining.

9. The coreless interposer of claim 1, further comprising:
a coreless package coupled to the coreless interposer; and
a die coupled to the coreless package.

10. A coreless interposer, comprising:
a plurality of buildup layers wherein electrical routing is provided in the plurality of buildup layers;
an inductor embedded in the plurality of buildup layers, wherein the inductor comprises:
a first magnetic block;
a second magnetic block, wherein the second magnetic block is connected to the first magnetic block by a first magnetic lid;
a third magnetic block;
a fourth magnetic block, wherein the fourth magnetic block is connected to the third magnetic block by a second magnetic lid; and
a first plurality of conductive loops surrounding the second magnetic block; and
a second plurality of conductive loops surrounding the third magnetic block.

11. The coreless interposer of claim 10, wherein the first plurality of conductive loops and the second plurality of conductive loops are disposed in more than one buildup layer of the plurality of buildup layers.

12. The coreless interposer of claim 10, further comprising:
shielding layers over a first end and a second end of the inductor.

13. The coreless interposer of claim 10, wherein the first plurality of conductive loops are electrically coupled to the second plurality of conductive loops.

14. The coreless interposer of claim 10, wherein the first magnetic block, the second magnetic block, the third magnetic block, and the fourth magnetic block pass through two or more buildup layers.

15. The coreless interposer of claim 10, wherein the first conductive loops and the second conductive loops are part of the electrical routing in the plurality of buildup layers.

16. The coreless interposer of claim 10, wherein the first magnetic block, the second magnetic block, the third magnetic block, and the fourth magnetic block comprise a first row of magnetic blocks, and wherein the inductor further comprises at least a second row of magnetic blocks.

17. The coreless interposer of claim 16, wherein the inductor further comprises:
a third plurality of conductive loops surrounding magnetic blocks in the second row of magnetic blocks; and
a fourth plurality of conductive loops surrounding magnetic blocks in the second row of magnetic blocks.

18. The coreless interposer of claim 10, wherein the first magnetic block, the second magnetic block, the third magnetic block, and the fourth magnetic block are cylinders.

19. An electronic system, comprising:
a board;
a coreless interposer coupled to the board, wherein the coreless interposer comprises:
an embedded inductor, comprising a plurality of discrete magnetic shells with a conductive layer lining an interior surface of each of the plurality of discrete magnetic shells;
a coreless patch coupled to the coreless interposer; and
a die coupled to the coreless patch.

20. The electronic system of claim 19, wherein the inductor is vertically oriented, and wherein the inductor passes through a plurality of buildup layers of the coreless interposer.

21. A coreless interposer, comprising:
- a plurality of buildup layers, wherein electrical routing is provided in the plurality of buildup layers;
- a first inductor embedded in the plurality of buildup layers, wherein the first inductor comprises:
  - a first magnetic shell; and
  - a first conductive lining over an interior surface of the first magnetic shell; and
- a second inductor embedded in the plurality of buildup layers, wherein the second inductor comprises:
  - a second magnetic shell; and
  - a second conductive lining over an interior surface of the second magnetic shell.

22. The coreless interposer of claim 21, wherein a first end of the first inductor is electrically coupled to a first end of the second inductor by a trace.

23. The coreless interposer of claim 21, wherein each of the first inductor and the second inductor extends through two or more of the plurality of buildup layers.

24. The coreless interposer of claim 21, wherein a first end of each of the first inductor and the second inductor is below a topmost buildup layer, and wherein a second end of each of the first inductor and the second inductor is above a bottommost buildup layer.

25. The coreless interposer of claim 21, further comprising:
- a first plug within the first conductive lining; and
- a second plug within the second conductive lining.

* * * * *